United States Patent
Bibes

(10) Patent No.: US 9,007,820 B2
(45) Date of Patent: Apr. 14, 2015

(54) DEVICE CONSISTING OF VARIOUS THIN FILMS AND USE OF SUCH A DEVICE

(75) Inventor: Manuel Bibes, Paris (FR)

(73) Assignees: Thales, Neuilly sur Seine (FR); Centre National de la Recherche Scientifique (C.N.R.S), Paris (FR)

(*) Notice: Subject to any disclaimer, the term of this patent is extended or adjusted under 35 U.S.C. 154(b) by 19 days.

(21) Appl. No.: 14/006,809

(22) PCT Filed: Mar. 23, 2012

(86) PCT No.: PCT/EP2012/055242
§ 371 (c)(1),
(2), (4) Date: Oct. 25, 2013

(87) PCT Pub. No.: WO2012/127043
PCT Pub. Date: Sep. 27, 2012

(65) Prior Publication Data
US 2014/0043895 A1    Feb. 13, 2014

(30) Foreign Application Priority Data
Mar. 23, 2011 (FR) .................................. 11 00874

(51) Int. Cl.
*G11C 11/00* (2006.01)
*G11C 11/16* (2006.01)
(Continued)

(52) U.S. Cl.
CPC ............ *G11C 11/1675* (2013.01); *H01L 43/08* (2013.01); *G11C 11/161* (2013.01); *G11C 11/221* (2013.01); *H01L 43/02* (2013.01); *Y10S 977/933* (2013.01); *Y10S 977/935* (2013.01)

(58) Field of Classification Search
USPC ......... 365/48, 55, 62, 66, 74, 78, 80–93, 100, 365/130, 131, 148, 158, 171–173, 225.5, 365/243.5; 257/421, E21.665; 438/3; 977/933–935
See application file for complete search history.

(56) References Cited

U.S. PATENT DOCUMENTS

2001/0055185 A1* 12/2001 Ooshima et al. ......... 360/324.12
2003/0107849 A1*  6/2003 Ikarashi .................... 360/324.1
(Continued)

FOREIGN PATENT DOCUMENTS

DE  10-2005-043574   10/2006
EP       2328194      6/2011
(Continued)

OTHER PUBLICATIONS

Hu et al., "Electric-field control of stain-mediated magnetoelectric random access Memory," *J. Appl. Sci.*, 107(9): 1-10 (2010).
(Continued)

*Primary Examiner* — Harry W Byrne
(74) *Attorney, Agent, or Firm* — Knobbe, Martens, Olson & Bear, LLP

(57) ABSTRACT

A device comprising: an assembly consisting of two, respectively upper and lower thin layers each forming a ferromagnetic element and separated by a thin layer forming a non magnetic element, said assembly being made up so that the layers forming the ferromagnetic elements are magnetically coupled through the layer forming a non magnetic element; an electrode, a layer forming a ferroelectric element in which the polarization may be oriented in several directions by applying an electric voltage through said layer, said layer forming a ferroelectric element being positioned between the layer forming a lower ferromagnetic element and the electrode; said device being configured so as to allow control of the magnetic configuration of the layers forming ferromagnetic elements by the direction of the polarization in the layer forming a ferroelectric element.

10 Claims, 4 Drawing Sheets

(51) Int. Cl.
*H01L 43/08* (2006.01)
*G11C 11/22* (2006.01)
*H01L 43/02* (2006.01)

(56) References Cited

U.S. PATENT DOCUMENTS

| | | | |
|---|---|---|---|
| 2004/0013880 A1* | 1/2004 | Daughton et al. | 428/411.1 |
| 2004/0137275 A1* | 7/2004 | Jander et al. | 428/692 |
| 2005/0002126 A1* | 1/2005 | Fujiwara et al. | 360/324.1 |
| 2007/0253116 A1* | 11/2007 | Takahashi | 360/313 |
| 2008/0225583 A1* | 9/2008 | Guo et al. | 365/173 |
| 2008/0239930 A1 | 10/2008 | Saito et al. | |
| 2009/0067224 A1 | 3/2009 | Hochstrat et al. | |
| 2010/0065935 A1* | 3/2010 | Horng et al. | 257/421 |
| 2010/0102369 A1* | 4/2010 | Tian et al. | 257/295 |
| 2011/0007560 A1* | 1/2011 | Dieny et al. | 365/171 |

FOREIGN PATENT DOCUMENTS

| | | |
|---|---|---|
| WO | WO 2007/099277 | 9/2007 |
| WO | WO 2010/032574 | 3/2010 |

OTHER PUBLICATIONS

Pertsev et al., "Resistive switching via the converse magnetoelectric effect in ferromagnetic multilayers on ferroelectric substrated," *Nanotechnology*, 21(47): 1-7 (2010).

Search Report issued in Int'l Application No. PCT/EP2012/0552452 (2012).

* cited by examiner

DEVICE CONSISTING OF VARIOUS THIN FILMS AND USE OF SUCH A DEVICE

CROSS REFERENCE TO RELATED APPLICATIONS

This application is a U.S. nationalization under 35 U.S.C. §371 of International Application No. PCT/EP2012/055242, filed Mar. 23, 2012, which claims priority to French Patent Application No. 1100874, filed Mar. 23, 2011. The disclosures set forth in the referenced applications are incorporated herein by reference in their entireties.

The present invention relates to a device, belonging to the field of heterostructures of thin layers, which may notably be used as a memory element, as an element for processing information or as an element for magnetic recording.

More particularly, the invention fits into the scope of storing information in magnetic form, such as in magnetic random access memories (MRAMs).

In MRAMs, information is stored by the direction of the magnetization of a first (so-called «free») magnetic layer relatively to the direction of the magnetization of a second magnetic layer with quasi-fixed (so-called «blocked») magnetization. Both of these layers are separated by a fine layer of a non-magnetic material, generally an insulating material, thereby defining a magnetic tunnel junction. The resistance of the junction depends on the relative magnetic alignment of both layers, either parallel or anti-parallel, which allows the stored information to be read.

Present development of MRAMs is held back by the strong energy consumption of the writing operation during which the direction of the magnetization of the free layer is reversed, which corresponds to 180 degrees in its orientation.

In the first generations of MRAMs, this writing operation was achieved via the generation of a magnetic field by current lines located in proximity to the free layer.

In the second generation presently used, writing is achieved by means of a spin transfer phenomenon via the application of a strong current between both magnetic layers, through the insulating thin layer. Even if this new approach has given the possibility of reducing the writing power by several orders of magnitude, the latter always has the value of about 100 pJ/bit, a value much greater than the writing powers of the other technologies of random access memories, which are of the order of 0.1 pJ/bit for flash memories, 0.03 pJ/bit for ferroelectric RAMS (FeRAMs) and 1 pJ/bit for phase transition memories.

In order to solve the problems mentioned above, controlling the magnetization with an electric field was proposed via the utilization of the magnetoelectric coupling existing in systems which combine dielectric, piezoelectric and/or ferroelectric properties and magnetic properties.

In particular, in the case of systems combining ferroelectric properties and ferromagnetic properties, it seems to be possible to electrically control in a non-volatile way the magnetic properties by means of the non-volatile nature of ferroelectric materials.

In this novel way, the electric field is applied through an insulator (generally the dielectric, piezoelectric and/or ferroelectric compound) and therefore, the associated current is very low. The result of this is that the power associated with the manipulation of the magnetic properties via the utilization of magnetoelectric coupling is very low.

The main problem of this type of approaches, utilizing magnetoelectric coupling, is that they do not give the possibility at the present time of reversing the magnetization of a ferromagnetic layer in a reversible, reproducible way and without any applied magnetic field. At best, a rotation of 90 degrees is possible, which is insufficient.

Presently, three solutions are distinguished which aim at allowing non-volatile control of magnetization with an electric field, without any applied magnetic field.

A first approach combines piezoelectricity and magnetostriction. This approach does only allow non-volatile control if the piezoelectric material used is also ferroelectric. This solution conventionally combines a piezoelectric element and a ferromagnetic element. Under the application of an electric field through the piezoelectric element, the latter deforms (reverse piezoelectric effect). This deformation is transmitted to the ferromagnetic element which changes its magnetoelastic anisotropy energy. Potentially the result is a change in the easy magnetization axis and therefore a rotation of the magnetization by a maximum of 90 degrees.

In the second approach, the density of carriers in a ferromagnetic element adjacent to a ferroelectric element is controlled in a remanent way by the direction of the polarization in the ferroelectric element, which generates an electric field effect.

Indeed, in ferromagnetic conductors, several magnetic properties depend on the density of carriers, like the Curie temperature or the magnetocrystalline anisotropy. With this type of approach, it is therefore possible to change the Curie temperature and/or the direction of the easy magnetization axis in a remanent way. However, like in the case of the first approach, this only allows a rotation of the magnetization by a maximum of 90 degrees.

A third approach is related to the control of the exchange interaction at the interface present between a multiferroic (simultaneously magnetic and ferroelectric) material and a ferromagnetic element. If there exists a magnetoelectric coupling within the multiferroic, allowing its magnetic properties to be controlled by an electric field, and exchange coupling between the multiferroic and the ferromagnetic element, the application of an electric field through the multiferroic may allow the magnetic properties of the ferromagnetic element to be controlled, and notably the magnetization direction. Thus, a 180 degree rotation is possible a priori.

This approach would probably be very effective in a system using a multiferroic, both ferromagnetic and ferroelectric, material. However, this type of compound is extremely rare and presently it only exists at a low temperature. Very few materials, notably $BiFeO_3$, are multiferroic at room temperature and all of these are antiferromagnetic. This considerably complexifies the control of the exchange coupling between the multiferroic and the ferromagnetic material. In spite of significant research efforts, this approach has not given the possibility of reversibly controlling the inversion of a ferromagnetic layer by applying an electric field at room temperature.

The object of the invention is to propose a device with which it is possible to electrically reverse, i.e. change its orientation by 180 degrees, the magnetization of a ferromagnetic layer in a reversible, reproducible way and without any applied magnetic field.

For this purpose, the object of the invention is a device comprising:
 an assembly consisting of two respectively upper and lower thin layers, each forming a ferromagnetic element and separated by a thin layer forming a non-magnetic element, said assembly being made up so that the layers forming the ferromagnetic elements are magnetically coupled through the layer forming a non-magnetic element;
 an electrode, a layer forming a ferroelectric element in which the polarization may be oriented in several directions by applying an electric voltage through said layer, said layer forming a ferroelectric element positioned between the layer forming a lower ferromagnetic element and the electrode;

the device being configured so as to allow control of the magnetic configuration of the layers forming ferromagnetic elements by the direction of the polarization in the layer forming a ferroelectric element, the magnetic coupling between the lower layer forming a ferromagnetic element and the layer forming a ferroelectric element not being influenced by the direction of the polarization in the layer forming a ferroelectric element.

The device according to the invention may include one or several of the following features:

the layer forming an non-magnetic element may have a thickness comprised between 0.1 and 10 nm;

the layer forming a ferroelectric element may have a thickness comprised between 0.2 and 500 nm;

the device may comprise a system giving the possibility of setting the magnetization of a ferromagnetic material;

the system may consist of a layer of small thickness formed with an anti-ferromagnetic material;

the electrode may be formed with a ferromagnetic material; the layer forming a ferroelectric element may be adapted so as to let through a tunnel current between the ferromagnetic electrode and the layer forming a lower ferromagnetic element, said layer preferably having a thickness comprised between 0.2 and 10 nm; said system giving the possibility of setting the magnetization of a ferromagnetic material which may be adapted so as to set the magnetization of the layer forming an upper ferromagnetic element and that of the ferromagnetic electrode;

the layer forming a non-magnetic element may be conductive, said device being suitable for generating a dipolar magnetic field which depends on the magnetic configuration of the layers forming lower and upper ferromagnetic elements and which may be combined in the form of lines or networks for allowing generation and electric control of a magnetic field landscape.

The invention also relates to the use of a device according to the invention, in a three-terminal magnetic memory in which the magnetic information is written by applying an electric field applied through the ferroelectric element.

The invention also relates to the use of a device according to the invention, in a two-terminal magnetic memory in which the magnetic information is written by applying an electric field applied through the ferroelectric element.

The invention also relates to the use of a device according to the invention, in a system suitable for magnetic recording.

The invention will be better understood upon reading the description which follows, only given as an example and made with reference to the appended drawings, wherein.

Figure 1:
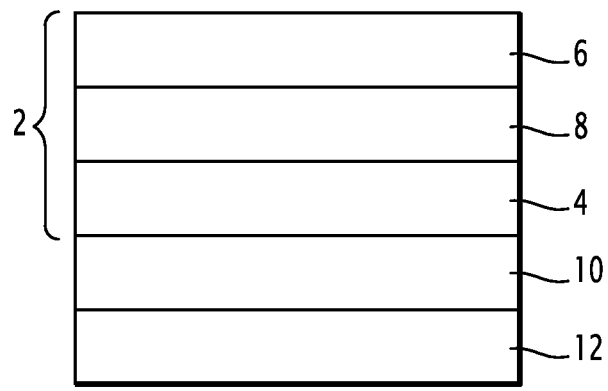
FIG. 1 is a sectional view of a device according to the invention.

The device illustrated in FIG. 1 includes an assembly 2 consisting of two thin layers 4, 6 each formed with a ferromagnetic material forming a ferromagnetic element, said ferromagnetic material being conductive and separated by a thin layer 8 formed with a non-magnetic material forming a non-magnetic element.

This assembly 2 is positioned on a thin layer 10 formed with a ferroelectric material and forming a ferroelectric element 10, said ferroelectric layer 10 being positioned in proximity to the so-called lower «ferromagnetic» layer 4, as opposed to the so-called «upper» ferromagnetic layer 6. Under the thin layer 10, a lower electrode 12 is positioned, allowing orientation of the polarization of the ferroelectric material in one direction or in another.

Thus, the ferroelectric layer 10 is positioned between the lower ferromagnetic layer 4 and the electrode 12.

The materials making up the thin layers 4, 6 may either be identical or different; examples of these materials will be given in the continuation of the description.

In a ferroelectric material, the polarization is remanent, i.e. it subsists even when the electric field having established the polarization disappears. By applying an opposite and sufficiently intense electric field, the polarization may be reversed and a remanent polarization with opposite orientation may be stabilized. This operation, which corresponds to the writing process of a FeRAM memory element, consumes very little energy. Thus, for a FeRAM, the writing energy is of the order of 0.03 pJ/bit.

Because a conductive layer, the lower layer 4, is in contact with the ferroelectric layer 10, the density of charge carriers in the conductive layer is modified depending on the direction of the polarization in the ferroelectric element. Thus, the carrier density may be modified in a remanent way, by applying an electric field through the ferroelectric element. This density modification either corresponds to an increase or to a decrease, depending on the direction of the polarization and of the type of carriers, either electrons or holes.

Moreover, it is established that the magnetization of ferromagnetic element adjacent to a ferroelectric element may depend on the direction of the polarization in the ferroelectric element [C. G. Duan et al, Phys. Rev. Lett. 97, 047201 (2006)].

The thickness of the non-magnetic layer 8 is selected so that both ferromagnetic layers 4, 6 are magnetically coupled via the Ruderman-Kittel-Kasuya-Yosida (RKKY) interaction [M. A. Ruderman & C. Kittel, Phys. Rev. 96, 99 (1954); T. Kasuya, Prog. Theor. Phys. 16, 45 (1956); K. Yosida, Physical Review 106, 893 (1957)].

Thus, preferably the ferromagnetic layers 4, 6 may have a thickness comprised between 0.2 and 50 nm, and preferably between 0.2 and 5 nm; the non-magnetic layer 8 may have a thickness comprised between 0.2 and 10 nm, and preferably between 0.2 and 5 nm; the ferroelectric layer 10 may have a thickness comprised between 0.2 and 500 nm, and preferably between 0.4 and 200 nm; and the electrode 12 may have a thickness comprised between 1 and 200 nm; and preferably between 2 and 50 nm.

The nature of the ferromagnetic or anti-ferromagnetic coupling depends on the thickness of the non-magnetic layer 8 according to an oscillating function (see for example K. B. Hathaway, «Ultrathin magnetic structures II», Springer-Verlag). The period of the oscillations itself depends on the electron structure of the materials in present, here the ferromagnetic layers 4, 6 and the non-magnetic layer 8, through their Fermi wave vector, to which is related the carrier density. The phase of the oscillation depends on the magnetization of the ferromagnetic layers 4, 6.

By combining the ferroelectric layer 10 and the assembly 2, it is therefore possible by applying an electric field through the ferroelectric layer 10, and for a suitably selected thickness of the non-magnetic layer 8, to control the magnetic configuration of both ferromagnetic layers 4, 6 and to orient their magnetizations along the same direction (case of ferromagnetic coupling) or along opposite directions (case of antiferromagnetic coupling).

Thus, if the magnetization of one of the ferromagnetic layers 4 or 6 is blocked, the magnetization of the second layer may be reversibly inverted reproducibly by applying an electric field.

Thus, the chain of physical mechanisms responsible for the effect may be summarized as follows:

the application of an electric field controls the orientation of the polarization of the ferroelectric layer 10;

the polarization of the ferroelectric layer 10 controls the carrier density and/or the value of the magnetization in the adjacent ferromagnetic layer 4;

the carrier density in the magnetic layer 4, adjacent to the ferroelectric layer 10, controls the period and/or the phase of the RKKY interaction according to the thickness of the non-magnetic layer 8 and/or to the value of the magnetization in the ferromagnetic layer 4;

the period and/or the phase of the RKKY interaction controls the nature of the (ferromagnetic/antiferromagnetic) coupling between both ferromagnetic layers 4 and 6;

the nature of the coupling between both ferromagnetic layers 4 and 6 controls the direction of their magnetizations.

It should be noted that this notably means that the magnetic coupling between the lower layer forming the lower ferromagnetic layer 4 and the layer forming a ferroelectric element 10 is not influenced by the direction of the polarization in the layer forming a ferroelectric element 10, i.e. the control of the coupling between both ferromagnetic layers 4, 6 is not achieved by means of magnetic coupling between the ferromagnetic coupling 10 and the lower ferromagnetic element 4.

As the mechanism proposed in the present invention controls the sign of magnetic coupling (either antiferromagnetic or ferromagnetic) and not the value of anisotropy, it is possible to electrically induce a complete reversal of the magnetization and not a simple rotation by 90 degrees like in the devices of the prior art.

In order to allow reversal of the magnetization of one of the two ferromagnetic layers 4 or 6, it is necessary to block the magnetization of the upper layer 6 of the assembly 2, opposite to the ferroelectric layer 10. This may be achieved in several ways. For example it is possible to give a preferential direction of the magnetization for one of the layers relatively to the other, for example these magnetic elements 4 and 6 may assume the shape of a flat and a very elongated parallelipiped. Another solution consists of coupling the upper ferromagnetic layer 6 with an antiferromagnetic material. This exemplary embodiment will be described subsequently.

We shall now describe examples of structures utilizing the devices according to the invention and applying the physical mechanisms described above.

Figure 2:
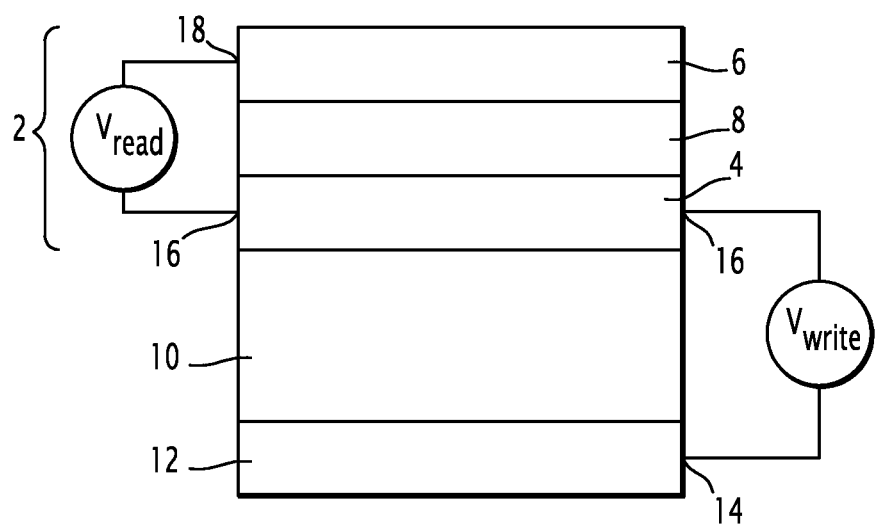
FIG. 2 is a sectional view belonging to a first structure using the device illustrated in FIG. 1.

The first example illustrated in FIG. 2 is a three-terminal electrically writeable magnetic memory.

In this example, the non-magnetic layer 8 may be insulating and then forms a tunnel barrier. The assembly 2, consisting of two thin layers 4, 6 each formed with a ferromagnetic material and separated by a thin layer 8, formed with a non-magnetic material, therefore forms a magnetic tunnel junction.

This structure comprises three electric terminals, a first one 14 on the lower electrode 12, a second one 16 on the lower ferromagnetic layer 4, and a third one 18 on the upper ferromagnetic layer 6.

The information is stored by the magnetic configuration of the ferromagnetic layers, the latter may be either parallel or antiparallel.

The information is written by applying an electric voltage «Vwrite» between the lower electrode 12 and the lower ferromagnetic layer 4.

The information is read by applying an electric voltage «Vread» between both ferromagnetic layers 4 and 6, and by reading the associated current, which depends on the magnetic configuration of these layers.

Figure 3:
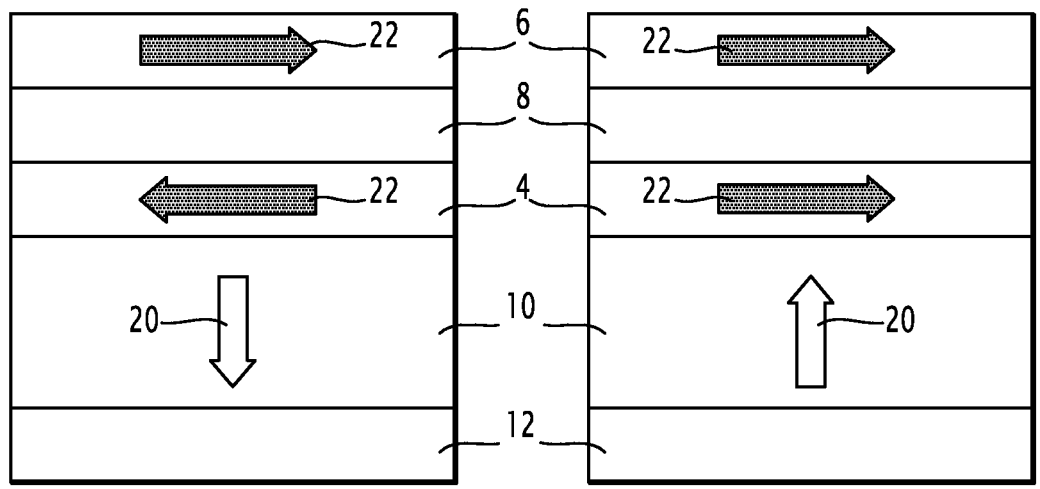
FIG. 3 illustrates two possible states of the memory with the structure of FIG. 2.

In FIG. 3, are illustrated two possible states of the memory, the white arrows 20 illustrating the electric polarization of the ferroelectric element 10 and the black arrows 22 illustrating the magnetization of the ferromagnetic elements 4 and 6.

Figure 4:
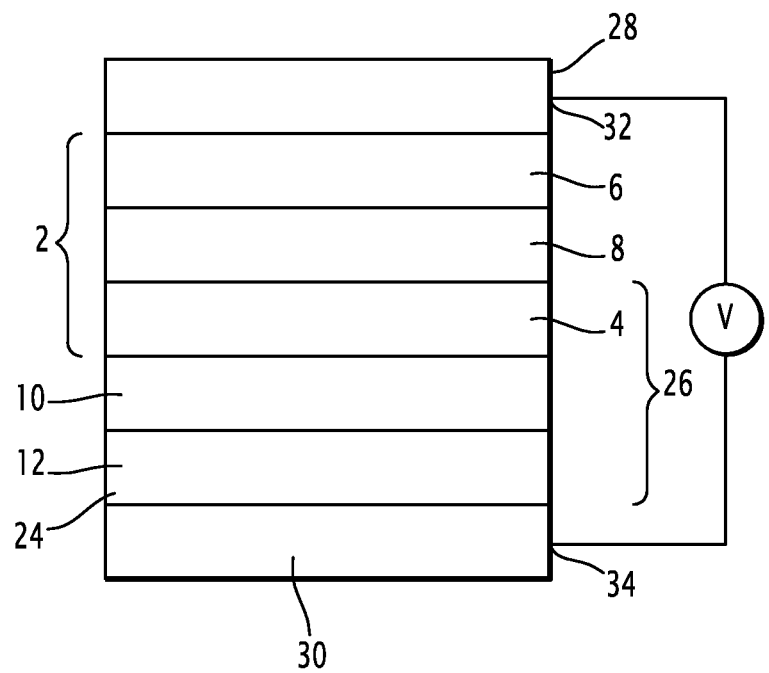
FIG. 4 is a sectional view belonging to a second structure using the device illustrated in FIG. 1.

The second example illustrated in FIG. 4 is a two-terminal electrically writeable magnetic memory.

This example consists of a device according to the invention comprising an assembly 2 consisting of two thin layers 4, 6 each formed with a ferromagnetic material and separated by a thin layer 8 formed with a non-magnetic material, the ferroelectric layer 10 and the lower electrode 12. In this example, the lower electrode 12 is formed with a ferromagnetic material 24.

The ferroelectric layer 10 is thin, it preferably has a thickness comprised between 0.2 and 10 nm. The ferroelectric layer 10 plays the role of a tunnel barrier and thus allows the current to pass between the lower ferromagnetic layer 4 and the ferromagnetic layer 24 forming the lower electrode 12.

The non-magnetic layer 8 may be metal or an insulator, and then also have the role of a tunnel barrier.

For proper operation of this structure, the resistance of the assembly 2 should be much lower than the resistance of the assembly 26 formed by the lower ferromagnetic layer 4, the ferroelectric layer 10 and the ferromagnetic layer 24.

Also, the directions of the magnetization of the upper ferromagnetic layer 6 and of the ferromagnetic layer 24 forming the lower electrode 12 have to be fixed, so that the magnetization of the lower ferromagnetic layer 4 may be reversed by inverting the polarization of the ferroelectric compound 10 by applying an electric field through this compound. In order that this condition be met, as illustrated in FIG. 4, a system giving the possibility of setting the magnetization of these layers is integrated to the structure.

This system comprises a conductive antiferromagnetic element 28 adjacent to the upper ferromagnetic layer 6 and a conductive antiferromagnetic element 30 adjacent to the ferromagnetic layer 24 forming the lower electrode 12.

These conductive antiferromagnetic elements 28, 30 may either be a layer of an antiferromagnetic conductor, or an artificial ferromagnetic system, or a multilayer assembly combining both of these types of elements.

Further, the structure comprises two electric terminals, a first one 32 connecting the upper ferromagnetic layer 6 and a second one 34 connecting the ferromagnetic layer 24. Alternatively, as illustrated in FIG. 5, the electric terminals may be connected via the conductive antiferromagnetic elements 28 and 30.

Figure 5:
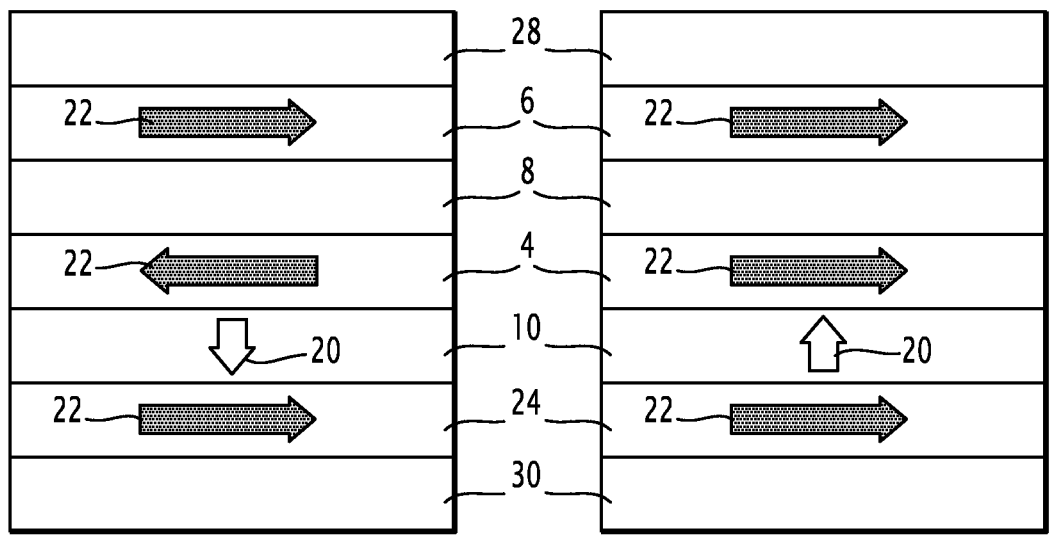
FIG. 5 illustrates two possible states of the memory with the structure of FIG. 4.

As shown in FIG. 5, the information is stored by the direction of the magnetization of the lower ferromagnetic layer 4.

The information is written by applying an electric voltage between the terminals 32 and 34. Typically a few volts are sufficient since they correspond to the voltages required for inverting the polarization present in the ferroelectric element.

The information is read by applying a lower voltage between the terminals 32 and 34, not modifying the direction of the polarization in the ferroelectric element 10, and by reading the associated current, which depends on the magnetic configuration in the layers 4 and 24.

In FIG. 5 are illustrated two possible states of the memory different by the directions 20 of the electric polarization and the directions 22 of the magnetization in the different layers, 4, 6, 10 and 24.

Figure 6:
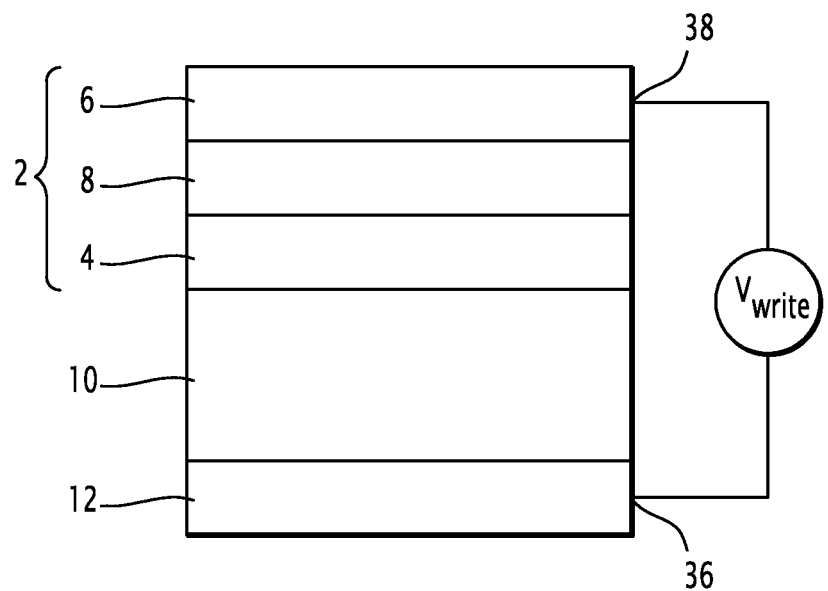
FIG. 6 is a sectional view belonging to a third structure using the device illustrated in FIG. 1.

The third example illustrated in FIG. 6 is an electrically controllable miniature magnetic field generator.

This example consists of a device according to the invention comprising an assembly 2 consisting of two thin layers 4, 6 each formed with a ferromagnetic material and separated by a thin layer 8 formed with a non-magnetic material, the ferroelectric layer 10 and the lower electrode 12. In this exemplary embodiment, the non-magnetic layer 8 is conductive.

Preferably the ferroelectric layer 10 has a thickness comprised between 0.4 and 200 nm.

The structure comprises two electric terminals, a first one 36 connecting the lower electrode 12 and a second one 38 connecting the upper ferromagnetic layer 6.

Figure 7:
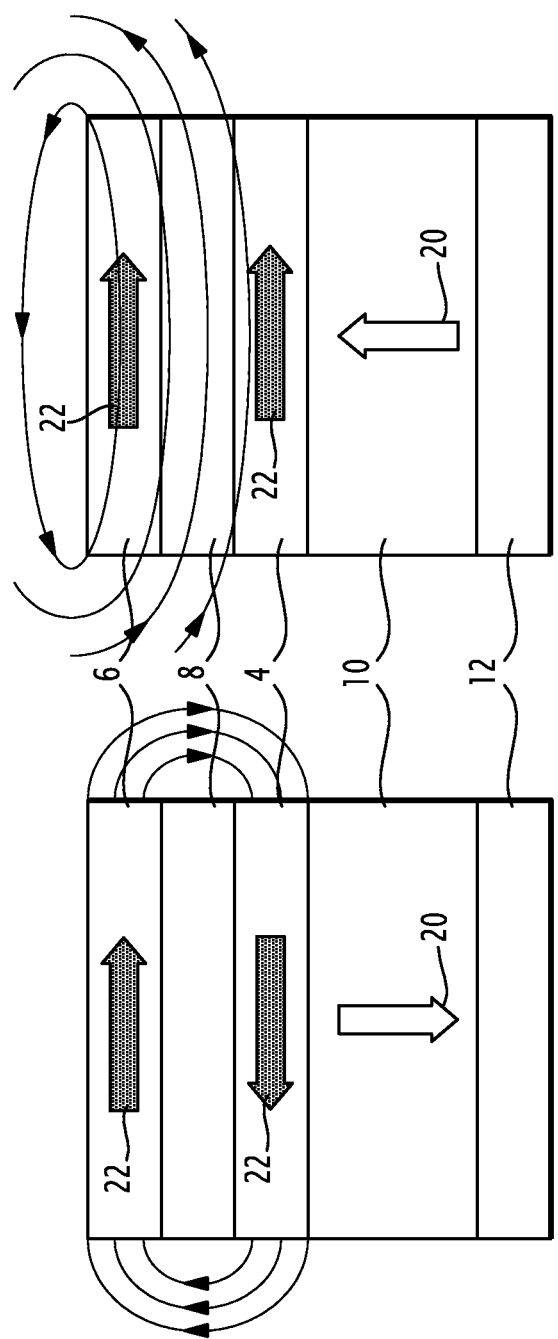
FIG. 7 illustrates two possible states of the magnetic configuration of the structure of FIG. 6.

As shown in FIG. 7, the ferromagnetic layers 4, 6 radiate a dipolar magnetic field which is different depending on whether the magnetizations of these layers are in a parallel configuration, i.e. in which the directions 22 of the magnetization are directed in the same direction or antiparallel, i.e. in which the direction 22 of the magnetizations are directed in opposite directions.

The control of the magnetic configuration by applying an electric field therefore gives the possibility of electrically controlling the dipolar magnetic field radiated in proximity to the structure.

By organizing structures such as the one schematized in FIG. 7 in the form of lines or networks, it is possible to generate at will via an electric route a magnetic field landscape with spatial resolution close to the size of the structures.

Depending on the polarization in the ferroelectric material, the magnetic configuration of the ferromagnetic layers 4, 6 is different which changes the magnetic field radiated nearby.

It is thus possible to use such a structure as multibit writing heads in systems for magnetic recording of information (hard discs or other discs).

The ferromagnetic elements belonging to the assembly 2 may be ferromagnetic metals (Co, Fe, Ni) or alloys thereof, or alloys of these metals with other elements $3d$ (Cr, Ni, Mn, etc.), $4d$ (Ru, Pd, etc.), $5d$ (Ir, Pt, etc.) or with rare earths (Gd, Tb, Dy, etc.), ferromagnetic oxides (like $SrRuO_3$ or $(La,Sr)MnO_3$) or magnetic semi-conductors (doped III-V elements such as Mn—GaAs, Mn—Ge, etc).

The non-magnetic element forming the thin layer 8 of assembly 2 may be a metal (Cu, Pt, Au, Cr, etc.), a semiconductor (GaAs, Si, etc.) or an insulator ($SrTiO_3$, MgO, etc.).

The ferroelectric layer 10 may consist of an inorganic ferroelectric material ($BaTiO_3$, $Pb(Zr,Ti)O_3$, $BiFeO_3$, SBT, SBN, etc.) or an organic ferroelectric material (PVDF, croconic acid, etc.).

The lower electrode 12 may consist of a metal or of a semi-conductor belonging to different families, for example simple metals such as Au, Ru or Pt, metal oxides such as $SrRuO_3$ or $(La,Sr)MnO_3$, semi-conductors such as Si, GaAs or other III-V compounds, semi-conductive oxides such as ZnO, ITO or $SrTiO_3$, or organic conductors; they may be of the n type or of the p type.

The antiferromagnetic element giving the possibility of setting the magnetization of a ferromagnetic layer may be a metal (IrMn, PtMn, etc.), an insulator (CoO, NiO, $LaFeO_3$, $BiFeO_3$, etc.). This may also be an artificial antiferromagnetic element consisting of a ferromagnetic layer, of a non-magnetic layer and of a ferromagnetic layer.

Conventionally, the device illustrated in FIG. 1 may be elaborated with one or several combined growth techniques, such as pulsed laser ablation, cathode sputtering, CVD, elaboration or other techniques.

Thus, the device according to the invention combines a ferroelectric element and a magnetic device in order to electrically control in a non-volatile way the magnetic (parallel/antiparallel) configuration of the ferromagnetic elements of the device.

The device according to the invention gives the possibility of controlling the RKKY exchange coupling between the ferromagnetic layers 4 and 6, via the non-magnetic layer 8, by polarization of a ferroelectric material 10. This ferroelectric control of the exchange coupling gives the possibility in a robust, reversible and non-volatile way of controlling the relative alignment of the magnetizations of both ferromagnetic layers of the assembly 2.

Advantageously, by magnetically blocking the magnetization of one of the two ferromagnetic layers, the direction of the magnetization of the other layer may thereby be controlled.

By means of the device of the invention, the magnetization of a ferromagnetic layer may be reversibly, reproducibly reversed without any magnetic field, while requiring only relatively low consumption of energy.

The invention claimed is:

1. A device comprising:
    an assembly consisting of two thin respectively upper and lower layers, each forming a ferromagnetic element and separated from one another by a thin layer forming a non magnetic element, said assembly being made up so that the layers forming the ferromagnetic elements are magnetically coupled through the layer forming a non magnetic element;
    an electrode,
    a layer forming a ferroelectric element in which the polarization may be oriented in several directions by applying an electric voltage through said layer, said layer forming a ferroelectric element being positioned between the layer forming a lower ferromagnetic element and the electrode;
    said device being configured so as to allow control of the magnetic configuration of the layers forming ferromagnetic elements by the direction of the polarization in the layer forming a ferroelectric element, the magnetic coupling between the lower layer forming a ferromagnetic element and the layer forming a ferroelectric element not being influenced by the direction of the polarization in the layer forming a ferroelectric element.

2. The device according to claim 1, wherein the layer forming a non magnetic element has a thickness comprised between 0.2 and 10 nm.

3. The device according to claim 1 wherein the layer forming a ferroelectric element has a thickness comprised between 0.2 and 500 nm.

4. The device according to claim 1 wherein it comprises a system giving the possibility of setting the magnetization of a ferromagnetic material.

5. The device according to claim 4, wherein said system consists of a layer of small thickness formed with an antiferromagnetic material.

6. The device according to claim 4, wherein:
the electrode is formed with a ferromagnetic material;
the layer forming a ferroelectric element is adapted to let through a tunnel current between the ferromagnetic electrode and the lower layer forming ferromagnetic element, said layer preferably having a thickness comprised between 0.2 and 10 nm;
said system with which the magnetization of a ferromagnetic material may be set, is adapted for setting the magnetization of the upper layer forming a ferromagnetic element and that of the ferromagnetic electrode.

7. The device according to claim 1, wherein the layer forming a non magnetic element is conductive, said device being adapted so as to generate a dipolar magnetic field which depends on the magnetic configuration of the layers forming lower and upper ferromagnetic elements and which may be combined in the form of lines or networks for allowing generation and electric control of a magnetic field landscape.

8. The use of a device according to claim 1, in a three terminal magnetic memory in which the magnetic information is written by applying an electric field applied through the ferroelectric element.

9. The use of a device according to claim 6 in a two terminal magnetic memory, in which the magnetic information is written by applying an electric field applied through the ferroelectric element.

10. The use of at least one device according to claim 7 in a system adapted for magnetic recording.

* * * * *